(12) United States Patent
Chun et al.

(10) Patent No.: US 9,123,800 B2
(45) Date of Patent: Sep. 1, 2015

(54) SEMICONDUCTOR DEVICE AND METHOD OF MANUFACTURING THE SAME

(71) Applicant: Hyundai Motor Company, Seoul (KR)

(72) Inventors: Dae Hwan Chun, Gyeonggi-do (KR); Kyoung-Kook Hong, Gyeonggi-do (KR); Jong Seok Lee, Gyeonggi-do (KR); Junghee Park, Gyeonggi-do (KR); Youngkyun Jung, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/317,426

(22) Filed: Jun. 27, 2014

(65) Prior Publication Data

US 2015/0187929 A1 Jul. 2, 2015

(30) Foreign Application Priority Data

Dec. 30, 2013 (KR) .................. 10-2013-0167816

(51) Int. Cl.
| | | |
|---|---|---|
| *H01L 29/12* | (2006.01) | |
| *H01L 29/16* | (2006.01) | |
| *H01L 29/36* | (2006.01) | |
| *H01L 29/78* | (2006.01) | |
| *H01L 21/205* | (2006.01) | |
| *H01L 21/335* | (2006.01) | |
| *H01L 21/762* | (2006.01) | |
| *H01L 29/66* | (2006.01) | |
| *H01L 29/06* | (2006.01) | |
| *H01L 29/423* | (2006.01) | |

(52) U.S. Cl.
CPC ........ *H01L 29/7811* (2013.01); *H01L 29/0619* (2013.01); *H01L 29/1608* (2013.01); *H01L 29/4238* (2013.01); *H01L 29/66068* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 6,445,037 | B1 * | 9/2002 | Hshieh et al. ................. | 257/330 |
| 6,750,511 | B2 * | 6/2004 | Kawano et al. ............... | 257/332 |
| 7,928,505 | B2 * | 4/2011 | Hirao et al. ................... | 257/330 |
| 8,154,074 | B2 * | 4/2012 | Yamamoto et al. ........... | 257/330 |
| 2008/0038890 | A1 * | 2/2008 | Tucker ........................... | 438/270 |
| 2011/0018005 | A1 * | 1/2011 | Nakano ........................... | 257/77 |
| 2013/0168761 | A1 * | 7/2013 | Hsieh ............................. | 257/330 |

FOREIGN PATENT DOCUMENTS

| | | |
|---|---|---|
| JP | 3701227 B2 | 9/2005 |
| JP | 2010-021175 A | 1/2010 |
| JP | 4825424 B2 | 11/2011 |
| KR | 10-1999-0069331 | 9/1999 |
| KR | 10-2005-0032753 A | 4/2005 |

* cited by examiner

*Primary Examiner* — Joseph Schoenholtz
(74) *Attorney, Agent, or Firm* — Mintz Levin Cohn Ferris Glovsky and Popeo, P.C.; Peter F. Corless

(57) ABSTRACT

A semiconductor device includes: a first n– type epitaxial layer disposed on a first surface of an n+ type silicon carbide substrate including a current carrying region and termination regions positioned at both sides of the current carrying region; a p type epitaxial layer disposed on the first n– type epitaxial layer; a second n– type epitaxial layer disposed on the p type epitaxial layer; a first trench disposed in the current carrying region; a second trench disposed in each termination region; a gate insulating layer disposed in the first trench; a gate electrode disposed on the gate insulating layer; and a termination insulating layer disposed in the second trench, in which a side of the termination insulating layer contacts the p type epitaxial layer and the second n– type epitaxial layer.

20 Claims, 11 Drawing Sheets

SEMICONDUCTOR DEVICE AND METHOD OF MANUFACTURING THE SAME

CROSS-REFERENCE TO RELATED APPLICATION

This application claims under 35 U.S.C. §119(a) priority to and the benefit of Korean Patent Application No. 10-2013-0167816 filed in the Korean Intellectual Property Office on Dec. 30, 2013, the entire contents of which are incorporated herein by reference.

BACKGROUND (a) Field of the Invention

The present invention relates to a semiconductor device including silicon carbide (SiC), and a method of manufacturing the same.

(b) Description of the Related Art

In the field of semiconductor manufacturing, due to enlargement and high capacity of applications, there is a need for a power semiconductor device having a high breakdown voltage, a high current, and a high-speed switching characteristic.

A silicon carbide (SiC) power semiconductor device has been studied as a power semiconductor device capable of satisfying requirements of a high breakdown voltage and a high current, and a high-speed switching characteristic, due to properties exceeding those of a silicon (Si) power semiconductor device.

In a semiconductor device, when a forward voltage is applied, the semiconductor device is divided into a current carrying region in which electrons flow and termination regions positioned at both sides of the current carrying region, where the termination region is a finished region of one semiconductor device and has a bend of a PN junction. As a result, when a backward voltage is applied, a depletion layer is formed along the bend of the PN junction, and an electric field is concentrated at the bend of the PN junction, and thus the breakdown voltage of the semiconductor device is reduced.

The above information disclosed in this Background section is only for enhancement of understanding of the background of the invention and therefore it may contain information that does not form the prior art that is already known in this country to a person of ordinary skill in the art.

SUMMARY

The present invention is directed to a semiconductor device and a method of manufacturing the same having advantages of preventing a depletion layer from being formed outside the semiconductor device in a silicon carbide MOSFET to which a trench gate is applied.

An exemplary embodiment of the present invention provides a semiconductor device, including: a first n− type epitaxial layer disposed on a first surface of an n+ type silicon carbide substrate including a current carrying region and termination regions positioned at both sides of the current carrying region; a p type epitaxial layer disposed on the first n− type epitaxial layer; a second n− type epitaxial layer disposed on the p type epitaxial layer; a first trench disposed in the current carrying region; a second trench disposed in each termination region; a gate insulating layer disposed in the first trench; a gate electrode disposed on the gate insulating layer; and a termination insulating layer disposed in the second trench, in which a side of the termination insulating layer contacts the p type epitaxial layer and the second n− type epitaxial layer.

The semiconductor device may further include: an n+ region disposed on a part of the second n− type epitaxial layer in the current carrying region; and a plurality of p+ regions disposed on a part of the p type epitaxial layer in the current carrying region.

The p+ regions may be disposed at both sides of the first trench, respectively, and the second n− type epitaxial layer and the n+ region may be disposed between the p+ region and the first trench.

The p+ region and the termination insulating layer may be spaced apart from each other, and a distance between the p+ region and the termination insulating layer may be about 20 µm to 100 µm.

The semiconductor device may further include: an oxide layer disposed on the gate electrode and extended up to the termination insulating layer; a source electrode disposed on the oxide layer in the current carrying region; a gate runner disposed on the oxide layer in each termination region; and a drain electrode positioned on a second surface of the n+ type silicon carbide substrate.

Channels may be disposed in the second n− type epitaxial layer at both sides of the first trench and the p type epitaxial layer at both sides of the trench.

The channels may include a first channel disposed in the p type epitaxial layer at both sides of the trench and a second channel disposed in the second n− type epitaxial layer at the both sides of the trench.

The first channel may be an inversion layer channel, and the second channel may be an accumulation layer channel.

A sum of thicknesses of the second n− type epitaxial layer and the n+ region disposed between the p+ region and the first trench may be the same as a thickness of the p+ region.

A doping concentration of the first n− type epitaxial layer may be the same as or different from a doping concentration of the second n− type epitaxial layer.

A depth of the first trench and a depth of the second trench may be the same as each other.

Another exemplary embodiment of the present invention provides a method of manufacturing a semiconductor device, including: forming a first n− type epitaxial layer on a first surface of an n+ type silicon carbide substrate including a current carrying region and termination regions positioned at both sides of the current carrying region; forming a p type epitaxial layer on the first n− type epitaxial layer; forming a preliminary second n− type epitaxial layer on the p type epitaxial layer; forming a p+ region in the current carrying region by injecting p+ ions into both edges of the preliminary second n− type epitaxial layer in the current carrying region; forming an n+ region and a second n− type epitaxial layer by injecting n+ ions into the preliminary second n− type epitaxial layer positioned between the p+ regions; forming a first trench in the current carrying region; forming a second trench in the termination region; forming a gate insulating layer inside the first trench and inside the second trench; forming a gate electrode on the gate insulating layer inside the first trench; forming an oxide layer on the gate electrode and the gate insulating layer inside the second trench; forming a source electrode positioned on the oxide layer in the current carrying region and a gate runner positioned on the oxide layer in the termination region; and forming a drain electrode on a second surface of the n+ type silicon carbide substrate, in which the gate insulating layer formed inside the second trench forms a termination insulating layer together with the oxide layer formed inside the second trench, and a side of the termination insulating layer contacts the p type epitaxial layer and the second n– type epitaxial layer.

The first trench may pass through the n+ region, the second n– type epitaxial layer, and the p type epitaxial layer, and be formed at a part of the first n– type epitaxial layer.

As such, according to the exemplary embodiment of the present invention, the termination insulating layer is disposed in the termination region of the semiconductor device to prevent a depletion layer from being formed at the outermost side of the semiconductor device.

Further, the p type epitaxial layer is extended from the current carrying region to the termination region to prevent an electric field from being concentrated in the termination region of the semiconductor device.

DETAILED DESCRIPTION OF THE EMBODIMENTS

Figure 1:
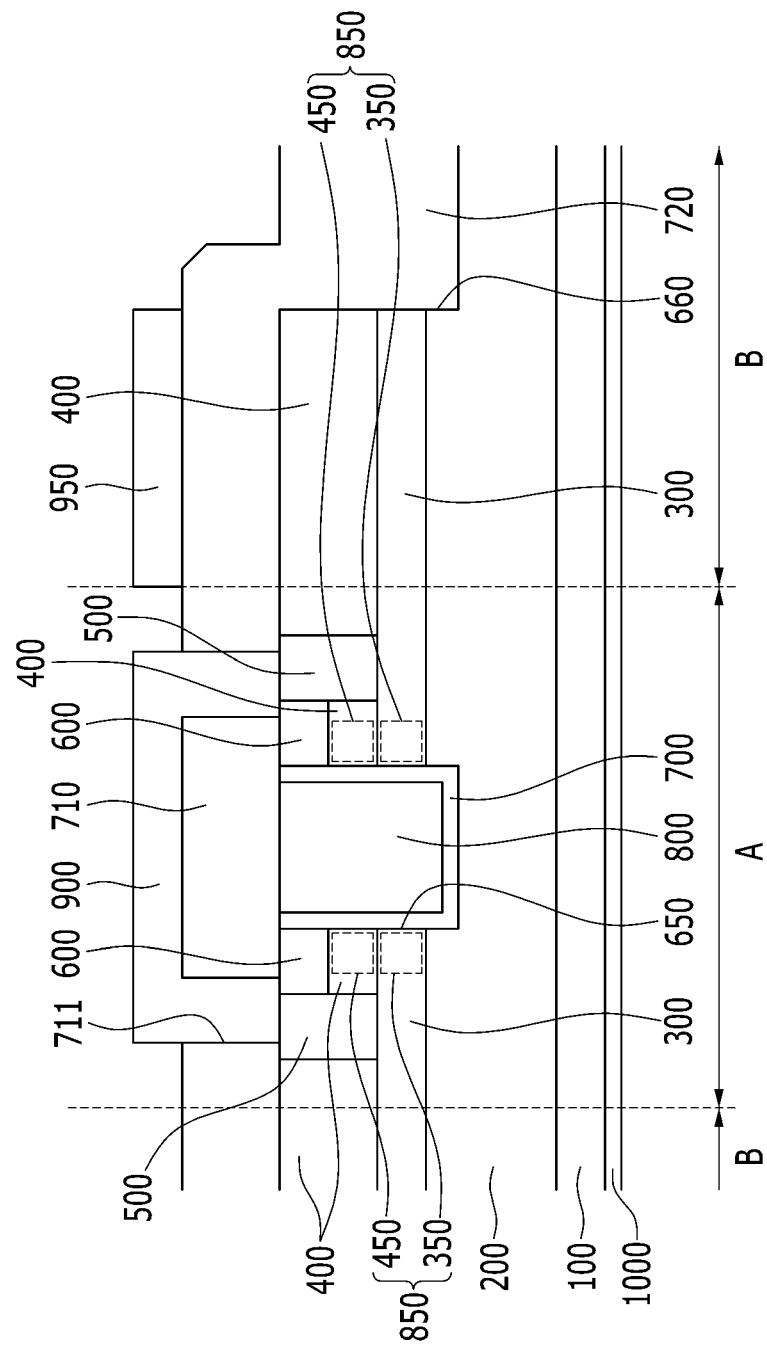
FIG. 1 is a cross-sectional view of a semiconductor device according to an exemplary embodiment of the present invention

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

FIG. 1 is a cross-sectional view of a semiconductor device according to an exemplary embodiment of the present invention.

Referring to FIG. 1, in a semiconductor device according to the exemplary embodiment, a first n– type epitaxial layer 200, a p type epitaxial layer 300, and a second n– type epitaxial layer 400 are sequentially disposed on a first surface of an n+ type silicon carbide substrate 100. The n+ type silicon carbide substrate 100 includes a current carrying region A and termination regions B positioned at both sides of the current carrying region A.

In particular, the current carrying region A is a region in which electrons flow when a forward voltage is applied. Doping concentrations of the first n– type epitaxial layer 200 and the second n– type epitaxial layer 400 may be the same as or different from each other.

An n+ region 600 is disposed on a part of the second n– type epitaxial layer 400 in the current carrying region A, and a p+ region 500 is disposed on a part of the p type epitaxial layer 300 in the current carrying region A.

A first trench 650 is disposed in the first n– type epitaxial layer 200, the p type epitaxial layer 300, the second n– type epitaxial layer 400, and the n+ region 600 in the current carrying region A. The first trench 650 passes through the p type epitaxial layer 300, the second n– type epitaxial layer 400, and the n+ region 600, and is formed in a part of the first n– type epitaxial layer 200.

The p+ region 500 is separated from the first trench 650, and the p+ regions 500 are disposed at both sides of the first trench 650, respectively. The second n– type epitaxial layer 400 and the n+ region 600 are disposed between the first trench 650 and the p+ region 500. A sum of thicknesses of the second n– type epitaxial layer 400 and the n+ region 600 disposed between the first trench 650 and the p+ region 500 is substantially the same as a thickness of the p+ region 500.

A second trench 660 is disposed in the first n– type epitaxial layer 200 in the termination region B. A side of the second trench 660 is positioned in the p type epitaxial layer 300 and the second n– type epitaxial layer 400. Depths of the first trench 650 and the second trench 660 may be the same as each other.

A gate insulating layer 700 is formed in the first trench 650, and a gate electrode 800 is disposed on the gate insulating layer 700. An oxide layer 710 is disposed on the gate electrode 800, the gate insulating layer 700, and the second n– type epitaxial layer 400. The gate electrode 800 substantially fills the first trench 650, and the gate insulating layer 700 and the oxide layer 710 may be made of silicon dioxide ($SiO_2$).

A termination insulating layer 720 is disposed in the second trench 660. The termination insulating layer 720 is made of the same material as the gate insulating layer 700 and the oxide layer 710. The termination insulating layer 720 is connected to the oxide layer 710, and the side of the termination insulating layer 720 contact the first n− type epitaxial layer 200, the p type epitaxial layer 300, and the second n− type epitaxial layer 400. In particular, the p+ region 500 and the termination insulating layer 720 are spaced apart from each other, and a distance between the p+ region 500 and the termination insulating layer 720 may be about 20 µm to 100 µm. More preferably, the distance between the p+ region 500 and the termination insulating layer 720 may be about 20 µm to 35 µm.

In the oxide layer 710, an opening 711 exposing parts of the p+ region 500 and the n+ region 600 is formed, and a source electrode 900 is disposed on the oxide layer 710 in the current carrying region A. The source electrode 900 contacts the parts of the p+ region 500 and the n+ region 600 through the opening 711.

A gate runner 950 is disposed on the oxide layer 710 in the termination region B. The gate runner 950 serves to rapidly apply a gate voltage to the gate electrode 800.

A drain electrode 1000 is disposed on a second surface of the n+ type silicon carbide substrate 100.

Channels 850 of the semiconductor device are formed in the p type epitaxial layer 300 at both sides of the first trench 650 and the second n− type epitaxial layer 400 at both sides of first the trench 650. The channels 850 include a first channel 350 and a second channel 450. The first channel 350 is an inversion layer channel formed in the p type epitaxial layer 300 at both sides of the first trench 650, and the second channel 450 is an accumulation layer channel formed in the second n− type epitaxial layer 400 at both sides of the first trench 650.

As such, since the channels 850 include the first channel 350, which is the inversion layer channel, and the second channel 450, which is the accumulation layer channel, the semiconductor device according to the present invention provides an effect of having advantages of both the inversion layer channel and the accumulation layer channel.

The semiconductor device including only the accumulation layer channel has an advantage of preventing a reduction in electron mobility to decrease on resistance, but a thickness of the gate insulating layer 700 is increased due to a low threshold voltage. The gate insulating layer 700 is difficult to grow in silicon carbide, and thus difficulty in the process is increased as the thickness of the gate insulating layer 700 is increased.

Further, in the semiconductor device including only the inversion layer channel, due to a sufficient threshold voltage, the thickness of the gate insulating layer 700 in the current carrying region A is smaller than the thickness of the gate insulating layer 700 in the current carrying region A of the semiconductor device including only the accumulation layer channel. As a result, difficulty in the process is relatively decreased. However, since an interface state between the gate insulating layer 700 made of silicon dioxide and silicon carbide negatively influences a flow of electrons passing through the channel, mobility of the electrons is largely decreased.

Since the semiconductor device according to the exemplary embodiment includes the accumulation layer channel formed by accumulating a charge carrier, an effect of the interface between the gate insulating layer 700 and silicon carbide is comparatively less, and mobility of electrons is improved, and as a result, on resistance is reduced. Further, since the threshold voltage is sufficient as the semiconductor device according to the exemplary embodiment includes the inversion layer channel, the thickness of the gate insulating layer 700 is not relatively large, and as a result, a manufacturing process may be improved.

Further, in the exemplary embodiment, the p type epitaxial layer 300 is extended from the current carrying region A to the termination region B. As a result, a PN junction without a bend, that is, the p type epitaxial layer 300 forms a junction surface without a bend with the first n− type epitaxial layer 200 and the second n− type epitaxial layer 400 in the termination region B. Accordingly, since the electric field is not concentrated in the termination region, the breakdown voltage of the semiconductor device is not reduced.

Further, in the related art, the depletion layer formed in the current carrying region A is extended to the termination region B to be formed outside the termination region B, but in the exemplary embodiment, the termination insulating layer 720 is disposed in the termination region B to prevent the depletion layer from being formed at the outermost side of the semiconductor device, that is, outside the termination region B.

Next, characteristics of a semiconductor device according to an Example and a semiconductor device according to Comparative Examples will be described with reference to FIGS. 2 to 4.

Figure 2:
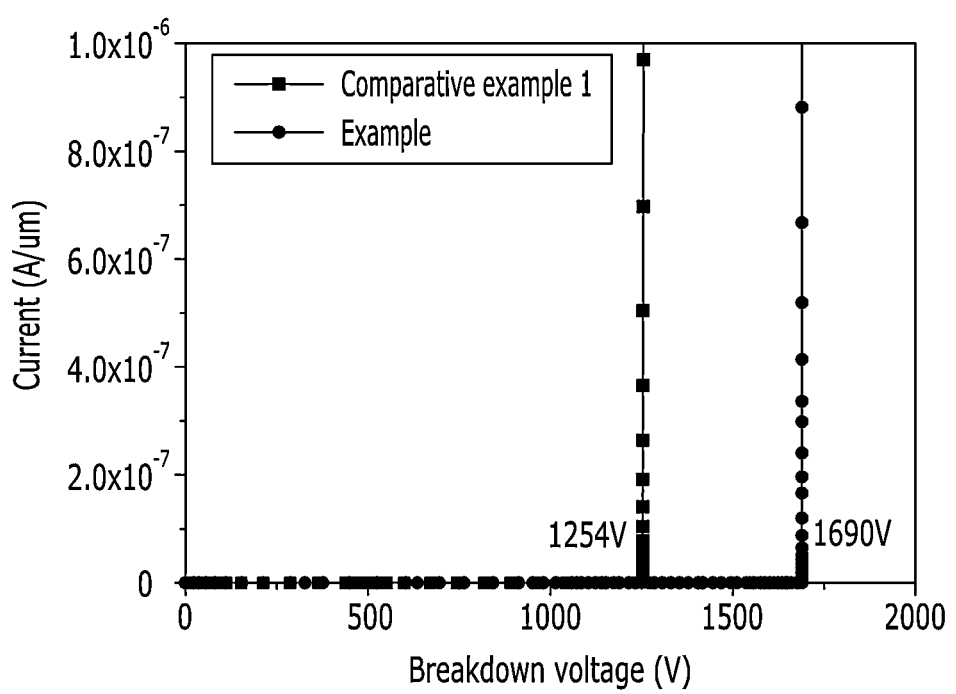
FIG. 2 is a graph illustrating a simulation result of breakdown voltages of a semiconductor device according to the Example and a semiconductor device according to Comparative Example 1.

FIG. 2 is a graph illustrating a simulation result of breakdown voltages of a semiconductor device according to the Example and a semiconductor device according to Comparative Example 1.

In FIG. 2, the semiconductor device according to Comparative Example 1 is a semiconductor device having a structure in which a p type epitaxial layer is not disposed in the termination region B.

Referring to FIG. 2, it can be seen that a breakdown voltage of the semiconductor device according to the Example is represented as 1,690 V, and a breakdown voltage of the semiconductor device according to Comparative Example 1 is represented as 1,254 V. In particular, it can be seen that in the case of the semiconductor device according to the Example, the breakdown voltage is increased as compared with the semiconductor device according to Comparative Example 1 in which the p type epitaxial layer is not disposed. Further, according to the increase in the breakdown voltage, a thickness of the epitaxial layer may be reduced, and as a result, the on resistance of the semiconductor device may be reduced.

Figure 3:
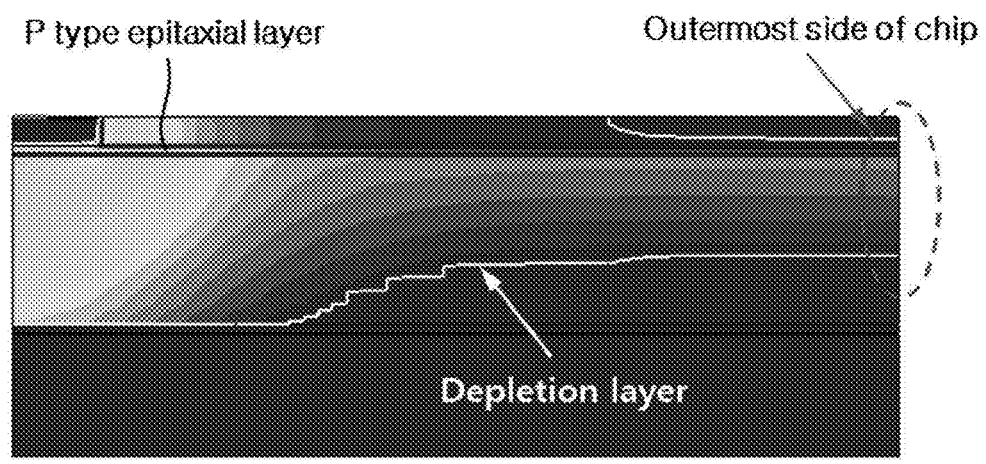
FIG. 3 is a diagram illustrating a simulation result of formation of a depletion layer in a termination region of a semiconductor device according to Comparative Example 2.

FIG. 3 is a diagram illustrating a simulation result of formation of a depletion layer in a termination region of a semiconductor device according to Comparative Example 2.

Figure 4:
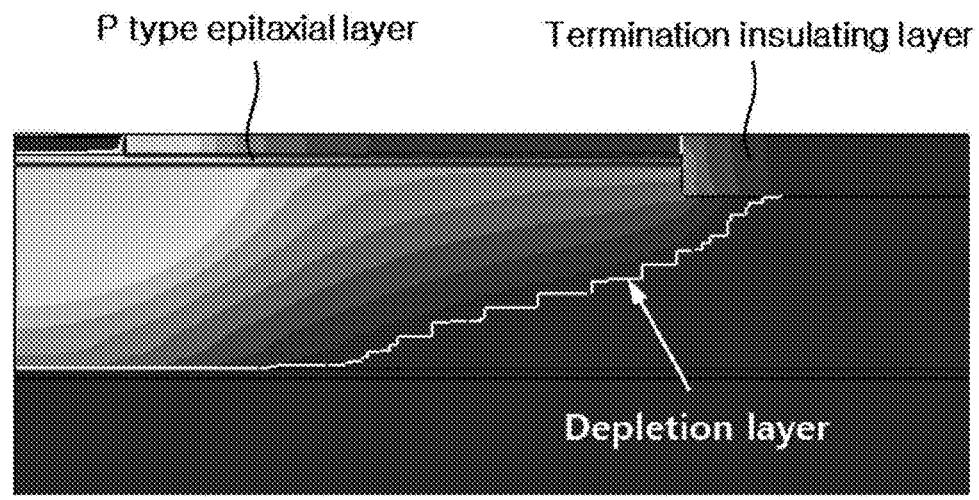
FIG. 4 is a diagram illustrating a simulation result of formation of a depletion layer in a termination region of a semiconductor device according to the Example.

FIG. 4 is a diagram illustrating a simulation result of formation of a depletion layer in a termination region of a semiconductor device according to the Example.

In FIG. 3, the semiconductor device according to Comparative Example 2 is a semiconductor device having a structure in which a p type epitaxial layer is disposed in the termination region B, but the termination insulating layer is not disposed.

Referring to FIGS. 3 and 4, it can be seen that in the semiconductor device according to Comparative Example 2, the depletion layer is formed at the outermost side of the semiconductor device, and in the case of the semiconductor device according to the Example, it is verified that the depletion layer is not formed at the outermost side of the semiconductor device by the termination insulating layer.

Next, a distance between the second trench and the p+ region and a depth of the second trench in the semiconductor device according to the Example will be described with reference to FIG. 5.

Figure 5:
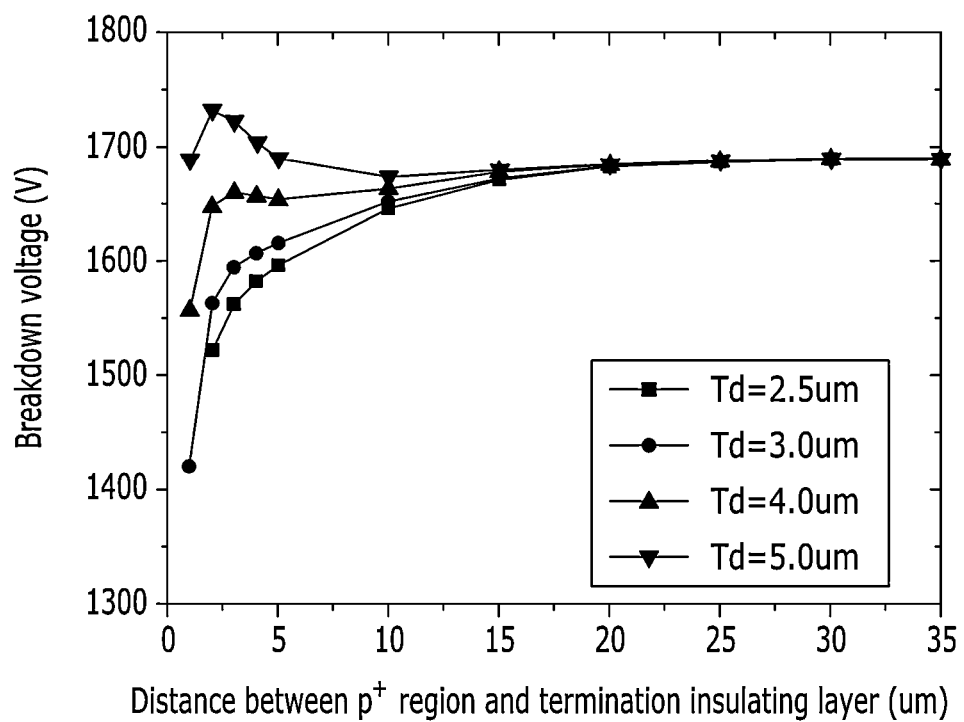
FIG. 5 is a graph illustrating a simulation result of a breakdown voltage according to a distance between a second trench and a p+ region and a depth of the second trench in the semiconductor device according to the Example.

FIG. 5 is a graph illustrating a simulation result of a breakdown voltage according to a distance between the second trench and the p+ region and a depth of the second trench in the semiconductor device according to the Example.

In the Example, the second trench is formed in the termination region, and the termination insulating layer is formed in the second trench. The second trench and the p+ region are spaced apart from each other.

In FIG. 5, a change in breakdown voltage according to a distance between the second trench and the p+ region will be described while the depth of the second trench is changed to 2.5 μm, 3.0 μm, 4.0 μm, and 5.0 μm.

Referring to FIG. 5, it can be seen that when the distance between the second trench and the p+ region is 20 μm to 35 μm, the breakdown voltage is constant regardless of the depth of the second trench. As a result, when the distance between the second trench and the p+ region is 20 μm to 35 μm, there is no correlation between the depth of the second trench and the breakdown voltage, and thus there is no need to accurately etch the second trench to have a predetermined depth during the etching of the second trench, thereby reducing difficulty in the process.

Next, a method of manufacturing a semiconductor device according to another exemplary embodiment of the present invention will be described in detail with reference to FIGS. 6 to 12, along with FIG. 1.

FIGS. 6 to 12 are diagrams sequentially illustrating a method of manufacturing a semiconductor device according to another exemplary embodiment of the present invention.

Figure 6:
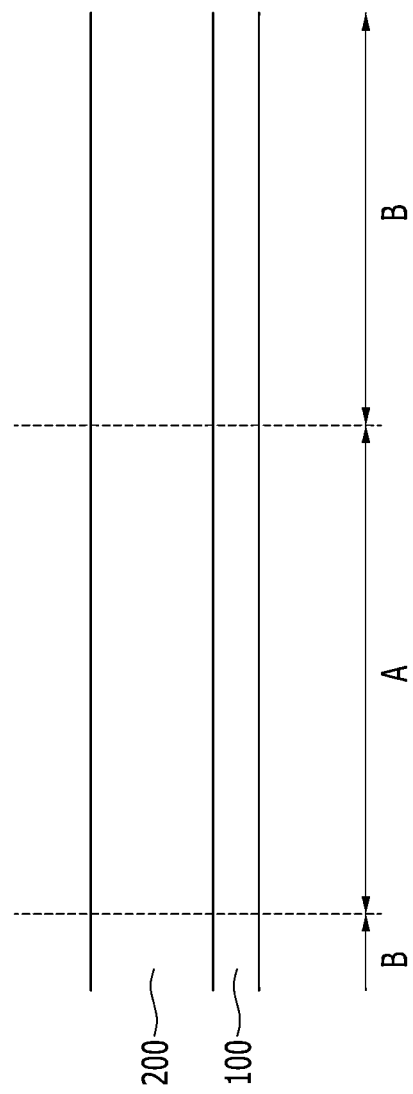
FIGS. 6 to 12 are diagrams sequentially illustrating a method of manufacturing a semiconductor device according to another exemplary embodiment of the present invention.

Referring to FIG. 6, the n+ type silicon carbide substrate 100 including the current carrying region A and the termination regions B positioned at both sides of the current carrying region A is prepared, and the first n− type epitaxial layer 200 is formed on the first surface of the n+ type silicon carbide substrate 100 through a first epitaxial growth.

Figure 7:
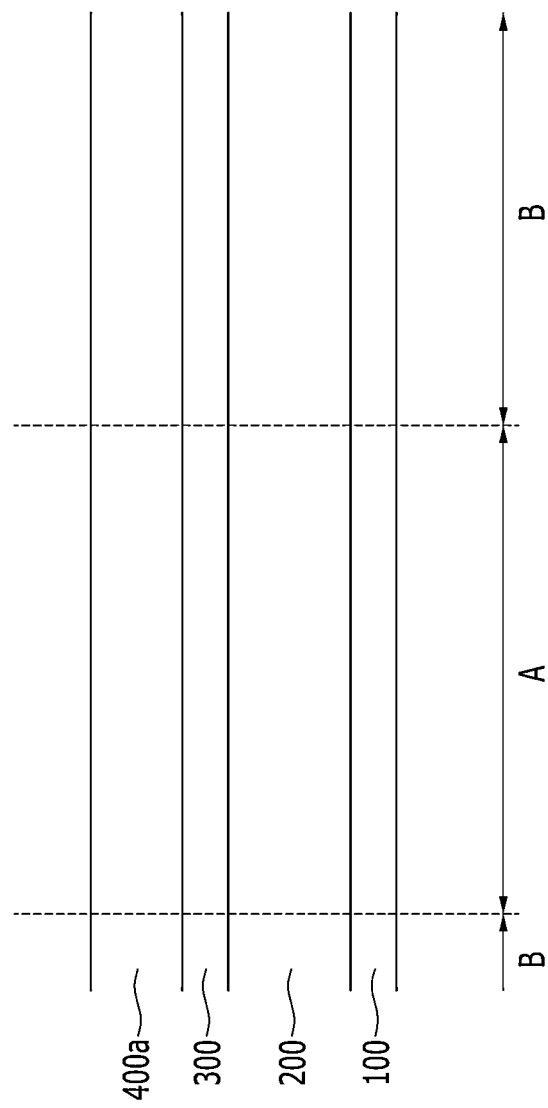

Referring to FIG. 7, after the p type epitaxial layer 300 is formed on the first n− type epitaxial layer 200 through a second epitaxial growth, a preliminary second n− type epitaxial layer 400a is formed on the p type epitaxial layer 300 through a third epitaxial growth. In particular, the doping concentrations of the first n− type epitaxial layer 200 and the preliminary second n− type epitaxial layer 400a may be the same as or different from each other. Further, the p type epitaxial layer 300 is not formed through the second epitaxial growth, but may be formed by injecting p ions on the first n− type epitaxial layer 200.

Figure 8:
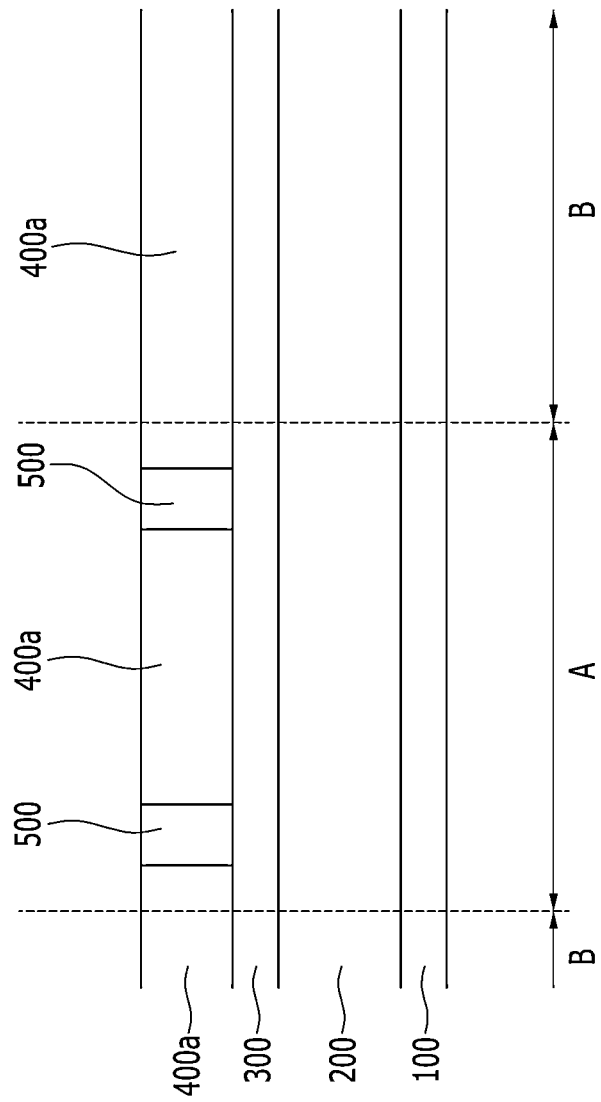

Referring to FIG. 8, the p+ region 500 is formed in the current carrying region A by injecting p+ ions into both edges of the preliminary second n− type epitaxial layer 400a in the current carrying region A. The p+ ions are injected up to a boundary of the preliminary second n− type epitaxial layer 400a and the p type epitaxial layer 300, and the p+ region 500 is formed on the p type epitaxial layer 300, and the upper surface of the p+ region 500 is positioned on an extended line of the upper surface of the preliminary second n− type epitaxial layer 400a. In particular, the injection of the p+ ions uses a mask (not illustrated). In particular, only both edges of the preliminary second n− type epitaxial layer 400a in the current carrying region A are exposed by using the mask, and the p+ ions are injected into the exposed portion of the preliminary second n− type epitaxial layer 400a. As such, since the p+ region 500 is formed by injecting the p+ ions, a trench for the p+ region 500 need not be formed.

Figure 9:
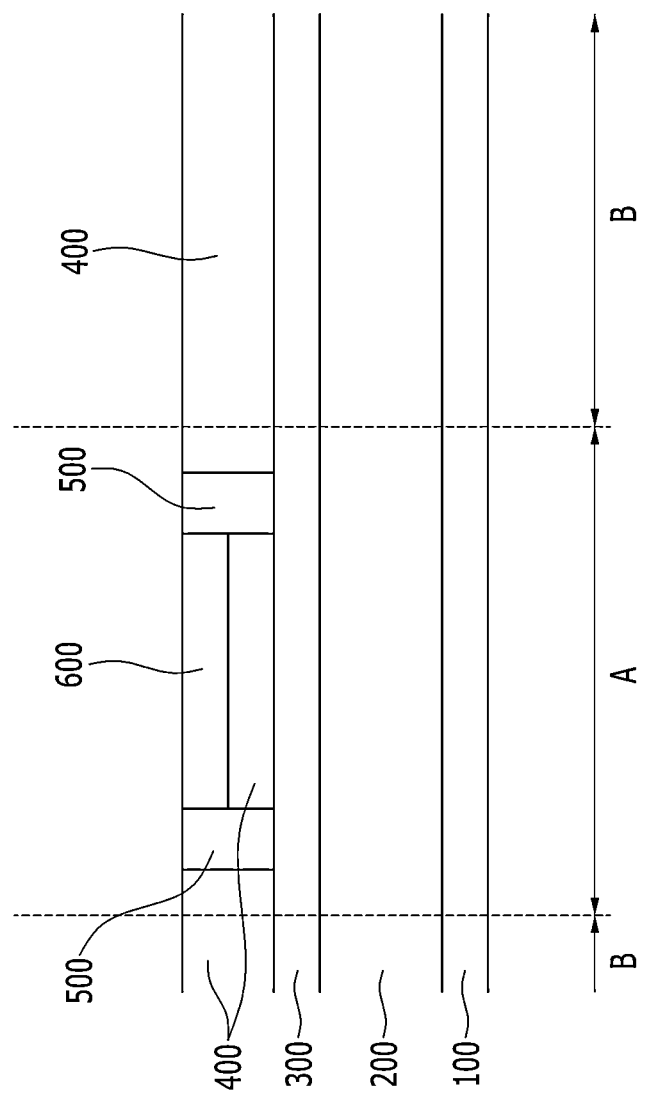

Referring to FIG. 9, the n+ region 600 is formed in the current carrying region A by injecting n+ ions into the preliminary second n− type epitaxial layer 400a in the current carrying region A. The n+ ions are injected into the preliminary second n− type epitaxial layer 400a positioned between the two p+ regions 500. The n+ ions are not injected up to a boundary of the preliminary second n− type epitaxial layer 400a and the p type epitaxial layer 300. As a result, the n+ region 600 is separated from the p type epitaxial layer 300, and the second n− type epitaxial layer 400 is formed between the n+ region 600 and the p type epitaxial layer 300. In this case, the remaining preliminary second n− type epitaxial layer 400a into which the n+ ions are not injected also becomes the second n− type epitaxial layer 400.

The edge of the n+ region 600 contacts the p+ region 500. The upper surface of the n+ region 600 is positioned on an extended line of the upper surface of the p+ region 500. A sum of thicknesses of the n+ region 600 positioned between the two p+ regions 500 and the second n− type epitaxial layer 400 is substantially the same as the thickness of the p+ region 500. Preferably, the injection of the n+ ions uses a mask (not illustrated). In particular, the two p+ regions 500 are exposed by using the mask, and the n+ ions are injected into the exposed preliminary second n− type epitaxial layer 400a.

Figure 10:
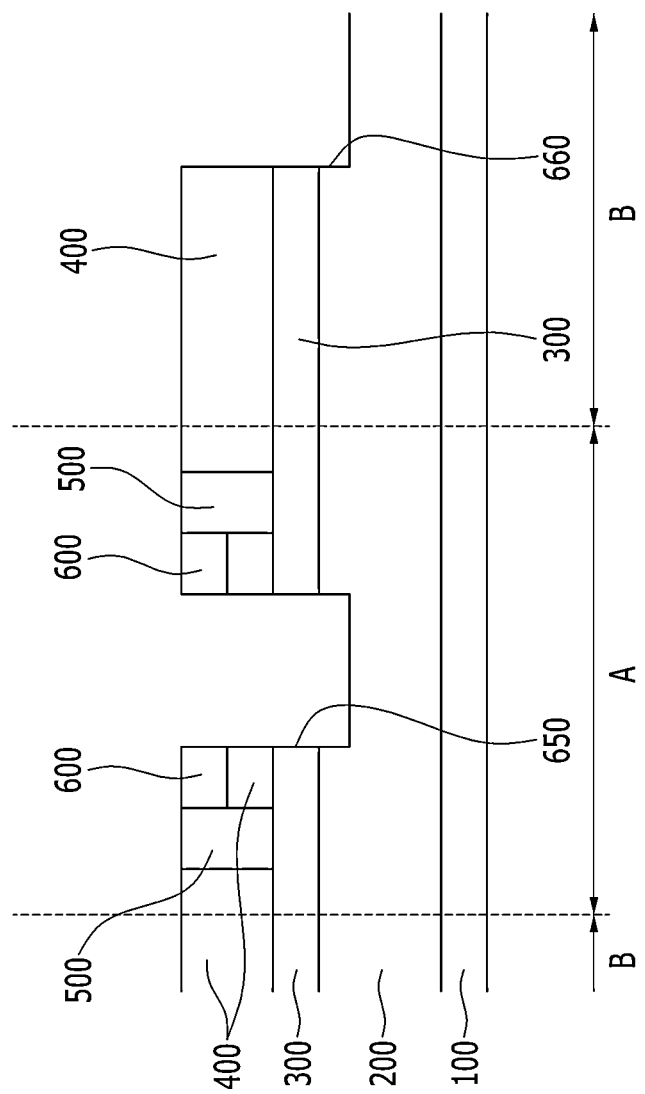

Referring to FIG. 10, the first trench 650 and the second trench 660 are formed by etching the first n− type epitaxial layer 200, the p type epitaxial layer 300, the second n− type epitaxial layer 400, and the n+ region 600.

The first trench 650 is formed in the current carrying region A, passes through the p type epitaxial layer 300, the second n− type epitaxial layer 400, and the n+ region 600, and is formed in a part of the first n− type epitaxial layer 200.

The second trench 660 is formed in the termination region B, and the side of the second trench 660 is positioned at the p type epitaxial layer 300, the second n− type epitaxial layer 400, and the n+ region 600, and a part of the first n− type epitaxial layer 200.

Depths of the first trench 650 and the second trench 660 may be the same as each other.

Figure 11:
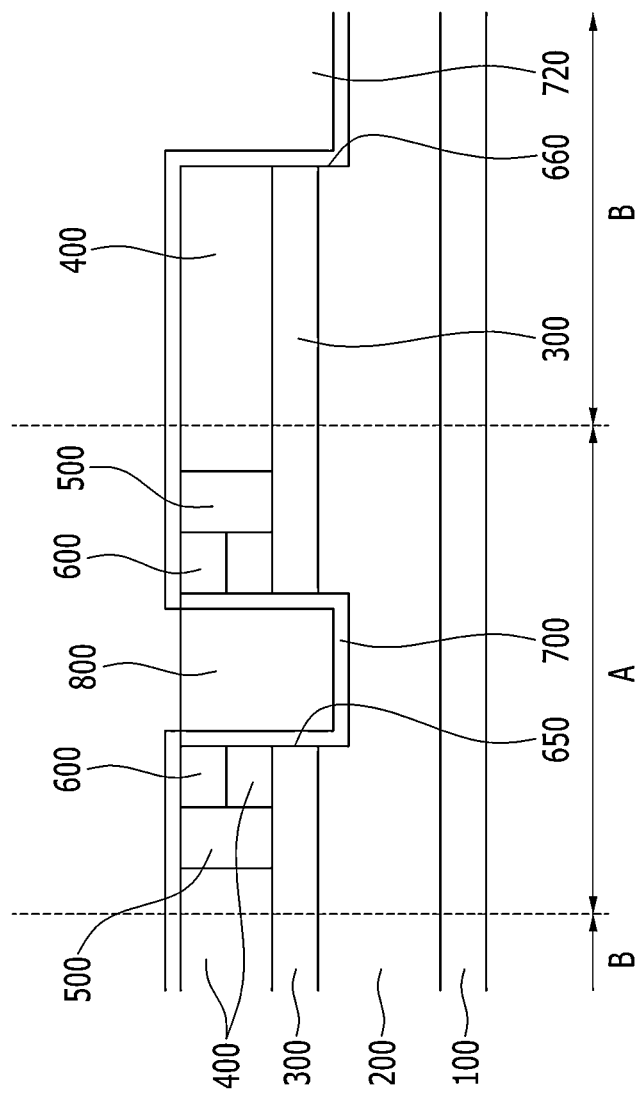

Referring to FIG. 11, after the gate insulating layer 700 is formed on the first trench 650, the second trench 660, the second n− type epitaxial layer 400, the p+ region 500, and the n+ region 600 by using silicon dioxide ($SiO_2$), the gate electrode 800 is formed on the gate insulating layer 700 in the first trench 650. In particular, the gate electrode 800 is formed to fill the first trench 650.

Figure 12:
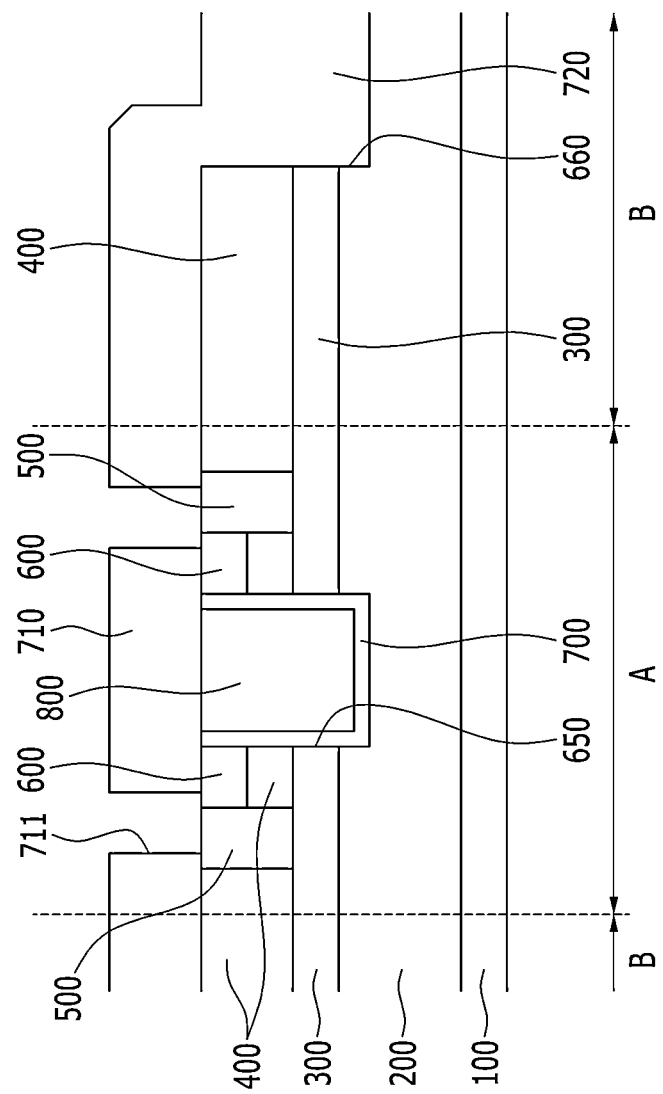

Referring to FIG. 12, after the oxide layer 710 is formed on the gate insulating layer 700 and the gate electrode 800 by using the same material as a formation material of the gate insulating layer 700, the opening 711 exposing the parts of the p+ region 500 and the n+ region 600 is formed in the oxide layer 710. In particular, the gate insulating layer 700 positioned in the second trench 660 forms the termination insulating layer 720 like the oxide layer 710. As a result, the termination insulating layer 720 is connected to the oxide layer 710.

Referring to FIG. 1, the source electrode 900 contacting the parts of the p+ region 500 and the n+ region 600 is formed on the oxide layer 710 in the current carrying region A through the opening 711, the gate runner 950 is formed on the oxide layer 710 in the termination region B, and the drain electrode 1000 is formed on the second surface of the n+ type silicon carbide substrate 100.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor device, comprising:
   a first n− type epitaxial layer disposed on a first surface of an n+ type silicon carbide substrate including a current carrying region and termination regions positioned at both sides of the current carrying region;

a p type epitaxial layer disposed on the first n– type epitaxial layer;

a second n– type epitaxial layer disposed on the p type epitaxial layer;

a first trench disposed in the current carrying region;

a second trench disposed in each termination region;

a gate insulating layer disposed in the first trench;

a gate electrode disposed on the gate insulating layer; and a termination insulating layer disposed in the second trench, wherein a side of the termination insulating layer contacts the p type epitaxial layer and the second n– type epitaxial layer.

2. The semiconductor device of claim 1, further comprising:

an n+ region disposed on a part of the second n– type epitaxial layer in the current carrying region; and a plurality of p+ regions disposed on a part of the p type epitaxial layer in the current carrying region.

3. The semiconductor device of claim 2, wherein the p+ regions are disposed at both sides of the first trench, respectively, and the second n– type epitaxial layer and the n+ region are disposed between the p+ region and the first trench.

4. The semiconductor device of claim 3, wherein the p+ region and the termination insulating layer are spaced apart from each other, and a distance between the p+ region and the termination insulating layer is 20 μm to 100 μm.

5. The semiconductor device of claim 4, further comprising:

an oxide layer disposed on the gate electrode and extended up to the termination insulating layer;

a source electrode disposed on the oxide layer in the current carrying region;

a gate runner disposed on the oxide layer in each termination region; and a drain electrode positioned on a second surface of the n+ type silicon carbide substrate.

6. The semiconductor device of claim 5, wherein channels are disposed in the second n– type epitaxial layer at both sides of the first trench and the p type epitaxial layer at both sides of the trench.

7. The semiconductor device of claim 6, wherein the channels include a first channel disposed in the p type epitaxial layer at both sides of the trench and a second channel disposed in the second n– type epitaxial layer at both sides of the trench.

8. The semiconductor device of claim 7, wherein the first channel is an inversion layer channel, and the second channel is an accumulation layer channel.

9. The semiconductor device of claim 8, wherein a sum of thicknesses of the second n– type epitaxial layer and the n+ region disposed between the p+ region and the first trench is the same as a thickness of the p+ region.

10. The semiconductor device of claim 1, wherein a doping concentration of the first n– type epitaxial layer is the same as or different from a doping concentration of the second n– type epitaxial layer.

11. The semiconductor device of claim 1, wherein a depth of the first trench and a depth of the second trench are the same.

12. A method of manufacturing a semiconductor device, comprising:

forming a first n– type epitaxial layer on a first surface of an n+ type silicon carbide substrate including a current carrying region and termination regions positioned at both sides of the current carrying region;

forming a p type epitaxial layer on the first n– type epitaxial layer;

forming a preliminary second n– type epitaxial layer on the p type epitaxial layer;

forming a p+ region in the current carrying region by injecting p+ ions into both edges of the preliminary second n– type epitaxial layer in the current carrying region;

forming an n+ region and a second n– type epitaxial layer by injecting n+ ions into the preliminary second n– type epitaxial layer positioned between the p+ regions;

forming a first trench in the current carrying region;

forming a second trench in each termination region;

forming a gate insulating layer inside the first trench and inside the second trench;

forming a gate electrode on the gate insulating layer inside the first trench;

forming an oxide layer on the gate electrode and the gate insulating layer inside the second trench;

forming a source electrode positioned on the oxide layer in the current carrying region and a gate runner positioned on the oxide layer in the termination region; and forming a drain electrode on a second surface of the n+ type silicon carbide substrate, wherein the gate insulating layer formed inside the second trench forms a termination insulating layer together with the oxide layer formed inside the second trench, and a side of the termination insulating layer contacts the p type epitaxial layer and the second n– type epitaxial layer.

13. The method of claim 12, wherein the first trench passes through the n+ region, the second n– type epitaxial layer, and the p type epitaxial layer, and is formed at a part of the first n– type epitaxial layer.

14. The method of claim 13, wherein the p+ regions are disposed at both sides of the first trench, respectively, and the second n– type epitaxial layer and the n+ region are disposed between the p+ region and the first trench.

15. The method of claim 14, wherein the p+ region and the termination insulating layer are spaced apart from each other, and a distance between the p+ region and the termination insulating layer is about 20 μm to 100 μm.

16. The method of claim 15, wherein channels are disposed in the second n– type epitaxial layer at both sides of the first trench and the p type epitaxial layer at both sides of the trench.

17. The method of claim 16, wherein the channels include a first channel disposed in the p type epitaxial layer at both sides of the trench and a second channel disposed in the second n– type epitaxial layer at both sides of the trench.

18. The method of claim 17, wherein the first channel is an inversion layer channel, and the second channel is an accumulation layer channel.

19. The method of claim 12, wherein a doping concentration of the first n– type epitaxial layer is the same as or different from a doping concentration of the second n– type epitaxial layer.

20. The method of claim 12, wherein a depth of the first trench and a depth of the second trench are the same.

* * * * *